US005479684A

United States Patent [19]

Murphy

[11] Patent Number: 5,479,684

[45] Date of Patent: Jan. 2, 1996

[54] METHOD OF MANUFACTURING INK JET PRINTHEADS BY INDUCTION HEATING OF LOW MELTING POINT METAL ALLOYS

[75] Inventor: Richard D. Murphy, Houston, Tex.

[73] Assignee: Compaq Computer Corporation, Houston, Tex.

[21] Appl. No.: 407,260

[22] Filed: Mar. 20, 1995

Related U.S. Application Data

[63] Continuation of Ser. No. 176,793, Dec. 30, 1993, abandoned.

[51] Int. Cl.[6] .......... H01L 41/22

[52] U.S. Cl. .......... 29/25.35; 29/890.1; 29/DIG. 22; 310/266

[58] Field of Search .......... 29/25.35, 890.1, 29/DIG. 13, DIG. 22; 219/615, 616, 633, 645, 646; 346/140.1, 141; 310/363, 364, 366, 367, 368; 427/100; 347/69–72

[56] References Cited

U.S. PATENT DOCUMENTS

| | | | |
|---|---|---|---|
| 2,636,134 | 4/1953 | Arons et al. | 29/25.35 X |
| 3,857,049 | 12/1974 | Zoltan | 310/369 X |
| 4,536,097 | 8/1985 | Nilsson | 347/71 |
| 4,584,590 | 4/1986 | Fischbeck et al. | 310/366 |
| 4,825,227 | 4/1989 | Fischbeck et al. | 347/69 |
| 4,879,568 | 11/1989 | Bartky et al. | 347/69 |
| 4,887,100 | 12/1989 | Michaelis et al. | 347/69 |
| 5,047,605 | 9/1991 | Ogden | 219/633 |
| 5,227,813 | 7/1993 | Pies et al. | 347/71 |
| 5,245,734 | 9/1993 | Issartel | 310/366 X |
| 5,327,627 | 7/1994 | Ochiai et al. | 29/890.1 X |

FOREIGN PATENT DOCUMENTS

| | | | |
|---|---|---|---|
| 3027652 | 2/1982 | Germany | 29/25.35 |
| 15287 | 2/1977 | Japan | 29/25.35 |
| 95418 | 7/1980 | Japan | 29/25.35 |
| 276887 | 12/1987 | Japan | 29/25.35 |
| 106084 | 5/1991 | Japan | 29/25.35 |
| 263807 | 11/1991 | Japan | 29/25.35 |

*Primary Examiner*—Peter Vo
*Attorney, Agent, or Firm*—Konneker & Bush

[57] ABSTRACT

Disclosed is a method of manufacturing an ink jet printhead comprising the steps of: (1) coating a substantially flat lower surface of an upper piezoelectric member with a first conductive coating, (2) coating a substantially flat upper surface of a lower piezoelectric member with a second conductive coating, (3) depositing a conductive metal over the first conductive coating, (4) forming a first elongated indentation in the lower surface, the first indentation extending through the first coating and into the upper member, (5) joining the metal with the second conductive coating by placing the upper piezoelectric member over the lower piezoelectric member, (6) inducing a current in the metal with an electromagnetic field having a specified frequency to thereby melt the metal and (7) cooling the metal, the metal electrically and mechanically joining the first coating to the second coating, the first indentation and the upper surface thereby forming the channel, the channel capable of containing ink and capable of ejecting ink therefrom when an electric current distorts the upper and lower piezoelectric members. The specified frequency allows the electromagnetic field to melt the metal completely without unduly heating the piezoelectric members.

18 Claims, 4 Drawing Sheets

METHOD OF MANUFACTURING INK JET PRINTHEADS BY INDUCTION HEATING OF LOW MELTING POINT METAL ALLOYS

This is a continuation of application Ser. No. 08/176,793, filed Dec. 30, 1993, now abandoned.

BACKGROUND OF THE INVENTION

1. Field of the Invention

The present invention is directed, in general, to printing heads for nonimpact printers and, more particularly, to a method of electrically and mechanically joining separate piezoelectric members into an ink jet printhead having an array of ink-jecting channels using electromagnetic induction heating.

2. Description of Related Art

Printers provide a means of producing a permanent record in human-readable form. Typically, a printing technique may be categorized as either impact printing or non-impact printing. Impact printing is typically effected by striking a ribbon placed near the surface of the paper to receive the print. Impact printing techniques may be further characterized as either formed-character printing or matrix printing. In formed-character printing, the element that strikes the ribbon to produce the image consists of a raised mirror image of the desired character. In matrix printing, the character is formed as a series of closely-spaced dots that are produced by striking a provided wire or wires against the ribbon. By selectively striking the provided wires, any character representable by matrix of dots can be produced.

Non-impact printing is often preferred over impact printing in view of its tendency to provide higher printing speeds as well as its better suitability for printing graphics and half-tone images. Non-impact printing techniques include matrix, electrostatic and electrophotographic printing techniques. In matrix printing, wires are selectively heated by electrical pulses and the heat thereby generated causes a mark to appear on a sheet of paper, usually a specially treated paper. In electrostatic printing, an electric arc between the printing element and the conductive paper removes an opaque coating on the paper to expose a sublayer of a contrasting color. Finally, in electrophotographic printing, a photoconductive material is selectively charged using a light source such as a laser. A powder toner is attracted to the charged regions and, when placed in contact with the sheet of paper, transfers to the paper's surface the powder toner. The toner is then subjected to heat that fuses it to the paper in the desired image.

Another form of non-impact printing is generally classified as ink jet printing. Ink jet printing systems use the ejection of tiny droplets of ink to produce an image. The devices produce highly reproducible and controllable droplets that are ejected precisely at a right time and velocity to produce a desired image on the paper. Most ink jet printing systems commercially available may be generally classified as either a "continuous jet" type ink jet printing system where droplets are continuously ejected from the printhead and either directed to or away from the paper depending on the desired image to be produced or as a "drop on demand" type ink jet printing system where droplets are ejected from the printhead in response to a specific command related to the image to be produced.

Continuous jet type ink jet printing systems are based upon the phenomenon of uniform droplet formation from a stream of liquid issuing from an orifice. It has been previously observed that fluid ejected under pressure from an orifice about 50 to 80 microns in diameter tends to break up into uniform droplets upon the amplification of capillary waves induced onto the jet, for example, by an electromechanical device that causes pressure oscillations to propagate through the fluid. Due to the small size of the droplets and the precise trajectory control, the quality of continuous jet type ink jet printing systems can approach that of formed-character impact printing systems. However, one drawback to continuous jet ink jet printing systems is that fluid must be jetting even when little or no printing is required. This requirement degrades the ink and decreases reliability of the printing system.

Due to this drawback, there has been increased interest in the production of droplets by electromechanically induced pressure waves. In this type of system, a volumetric change in the fluid is induced by the application of a voltage pulse to a piezoelectric material that is directly or indirectly coupled to the fluid. This volumetric change causes pressure/velocity transients to occur in the fluid and these are directed so as to produce a droplet that issues from an orifice. Since the voltage is applied only when a droplet is desired, these type of ink jet printing systems are referred to as drop-on-demand. For example, in FIG. 1, a drop-on-demand type ink jet printer is schematically illustrated. A nozzle assembly 306 draws ink from a reservoir (not shown). A driver 310 receives character data and actuates the piezoelectric material 308 in response thereto. For example, if the received character data requires that a droplet of ink is to be ejected from the nozzle assembly 306, the driver 310 applies a voltage to the piezoelectric material 308. The piezoelectric material 308 then deforms in a manner that forces the nozzle assembly 306 to eject a droplet of ink from the orifice 312. The ejected droplet then strikes a sheet of paper 318.

The use of piezoelectric materials in ink jet printers is well-known. Most commonly, piezoelectric material is used in the piezoelectric transducer by which electric energy is converted into mechanical energy by applying an electric field across the material, thereby causing the piezoelectric material to deform. This ability to distort piezoelectric material has often been used to force the ejection of ink from ink-carrying channels of ink jet printers. One such ink jet printer configuration that uses the distortion of a piezoelectric material to eject ink includes a tubular piezoelectric transducer that surrounds an ink-carrying channel. When the transducer is excited by the application of an electrical voltage pulse, the ink-carrying channel is compressed and a drop of ink is ejected from the channel. For example, an ink jet printer that uses circular transducers may be seen in U.S. Pat. No. 3,857,049 to Zoltan. However, the relatively complicated arrangement of the piezoelectric transducer and the associated ink-carrying channel causes such devices to be relatively time consuming and expensive to manufacture.

To reduce the per ink-carrying channel (or "jet") manufacturing costs of an ink jet printhead, in particular, those ink jet printheads having a piezoelectric actuator, it has long been desired to produce an ink jet printhead having a channel array in which the individual channels that comprise the array are arranged such that the spacing between adjacent channels is relatively small. For example, it would be very desirable to construct an ink jet printhead having a channel array where adjacent channels are spaced between approximately 4 and 8 mils apart. Such an ink jet printhead is hereby defined as a "high density" ink jet printhead. In addition to a reduction in the per ink-carrying channel manufacturing costs, another advantage that would result from the manufacture of an ink jet printhead with a high channel density would be an increase in printer speed. However, the very close spacing between channels in this high density ink jet printhead has long been a major problem in the manufacture of such printheads.

Recently, the use of shear mode piezoelectric transducers for ink jet printhead devices has become more common. For example, U.S. Pat. Nos. 4,584,590 and 4,825,227, both to Fischbeck, et al., disclose shear mode piezoelectric transducers for a parallel channel array ink jet printhead. In both of the Fischbeck, et al. patents, a series of open ended parallel ink pressure chambers are covered with a sheet of piezoelectric material along their roofs. Electrodes are provided on opposite sides of the sheet of piezoelectric material such that positive electrodes are positioned above the vertical wall separating pressure chambers and negative electrodes are positioned over the chamber itself. When an electric field is provided across the electrodes, the piezoelectric material, poled in a direction normal to the electric field direction, distorts in a shear mode configuration to compress the ink pressure chamber. In these configurations, however, much of the piezoelectric material is inactive. Furthermore, the extent of deformation of the piezoelectric material is small.

An ink jet printhead having a parallel channel array and that uses piezoelectric materials to construct the sidewalls of the ink-carrying channels may be seen in U.S. Pat. No. 4,536,097 to Nilsson. In Nilsson, an ink jet channel matrix is formed by a series of strips of piezoelectric material disposed in spaced-apart parallel relationship and covered on opposite sides by first and second plates. One plate is constructed of a conductive material and forms a shared electrode for all of the strips of piezoelectric material. On the other side of the strips, electrical contacts are used to electrically connect channel-defining pairs of the strips of piezoelectric material. When a voltage is applied to the two strips of piezoelectric material that define a channel, the strips become narrower and higher such that the enclosed cross-sectional area of the channel is enlarged and ink is drawn into the channel. When the voltage is removed, the strips return to their original shape, thereby reducing channel volume and ejecting ink therefrom.

An ink jet printhead having a parallel ink carrying channel array and that uses piezoelectric material to form a shear mode actuator for the vertical walls of the channel has also been disclosed. For example, U.S. Pat. Nos. 4,879,568 to Bartky, et al. and 4,887,100 to Michaelis, et al. each disclose an ink jet printhead array in which a piezoelectric material is used as the vertical wall along the entire length of each channel in forming the array. In these configurations, the vertical channel walls are constructed of two oppositely poled pieces of piezoelectric material mounted next to each other and sandwiched between top and bottom walls to form the ink channels. Once the ink channels are formed, electrodes are deposited along the entire height of the vertical channel wall. When an electric field normal to the poling direction of the pieces of piezoelectric material is generated between the electrodes, the vertical channel wall distorts to compress the ink jet channel in a shear mode fashion.

Finally, U.S. Pat. No. 5,227,813 to Pies, et al. is directed to a sidewall actuated channel array for a high density ink jet printhead. The sidewall actuator includes a top wall, a bottom wall and at least one elongated liquid confining channel defined by the top wall, the bottom wall and sidewalls. The actuator sidewall is comprised of a first actuator sidewall section formed of a piezoelectric material poled in a first direction perpendicular to a first channel and attached to the top wall, a second actuator sidewall section attached to the first sidewall section and the bottom wall and means for applying an electric field across the first actuator sidewall section and perpendicular to the direction of polarization. When the electric field is applied across the first sidewall section, the actuator sidewall engages in a motion that produces an ink-ejecting pressure pulse in the channel. The printhead configuration shown in Pies, et al. is referred to as a "double-u" configuration wherein each channel has a joint between piezoelectric pieces at a point in the sidewalls. Pies et al. discloses use of a conductive epoxy to join the various pieces of piezoelectric material together. The other ink jet printheads described above similarly use metal-bearing epoxy, epoxy with conductively-coated microbeads or epoxy preforms to join materials together.

A metal-bearing or microbead epoxies rely on making electrical contact between a plurality of metal pieces entrained within the substantially non-conducting epoxy material. While the epoxy material is used to make mechanical contact between the piezoelectric members, the metal pieces within the epoxy is used to make electrical contact. It is important in ink jet printheads to have a uniform electrical and mechanical bond between the various pieces making up the ink jet printhead. In many cases, and particularly for printheads, it is necessary to produce a minimal thickness bond of the order of several micrometers possessing reliably low electrical resistance normal to, and in the plane of, the bond. Thinness and a desirably high shear modulus of the material constituting the bond are difficult to obtain by traditional methods. The modulus of epoxy is considerably less than that of solders, but the conventional method of applying solder paste by stencil or screen methods have inherent practical limits on the thinness of the bond that can be produced.

What is needed in the art is a method of manufacturing an ink jet printhead that does not require use of a conductive epoxy, with all of its attendant manufacturing and operational disadvantages. The art also lacks a method of bonding piezoelectric materials together that is fast and does not harm the physical qualities of the piezoelectric material.

SUMMARY OF THE INVENTION

To address the above-discussed deficiencies of the prior art, it is a primary object of the present invention to provide a method of manufacturing a piezoelectric ink jet printhead and, more specifically, a simple, fast and highly reliable method of joining the various, differently-poled piezoelectric members in an ink jet printhead to electrically couple the members, allowing them to act in concert to controllably eject ink.

Accordingly, in solution of the primary object, the present invention provides a method of manufacturing an ink jet printhead comprising the steps of: (1) coating a substantially flat lower surface of an upper piezoelectric member with a first conductive coating, (2) coating a substantially flat upper surface of a lower piezoelectric member with a second conductive coating, (3) depositing a conductive metal over the first conductive coating, (4) forming a first elongated indentation in the lower surface, the first indentation extending through the first coating and into the upper member, (5) joining the metal with the second conductive coating by placing the upper piezoelectric member over the lower piezoelectric member, (6) inducing a current in the metal with an electromagnetic field having a specified frequency to thereby melt the metal and (7) cooling the metal, the metal electrically and mechanically joining the first coating to the second coating, the first indentation and the upper surface thereby forming the channel, the channel capable of containing ink and capable of ejecting ink therefrom when an electric current distorts the upper and lower piezoelectric members.

As mentioned previously, the prior art employs an electrically-conductive adhesive, such as Silver-filled epoxy, to bond the members together. In stark contrast, the present invention preferably makes use of Indium metal to metallurgically bond the members together. Indium has a melting point (157° C.) below the Curie point (around 250° C.) of the piezoelectric members. Thus, the Indium metal can be melted without destroying the poling within the members. Further, while not as good an electrical conductor as Gold, Silver or even Copper, Indium has sufficient conductivity to electrically join the members together, resulting in a uniform electromagnetic field for distorting the members to eject ink. The prior art Silver-filled epoxy tended to make unreliable, uneven electrical contact between the members, distorting the field to varying degrees from printhead to printhead, lowering production yield. Those skilled in the art will perceive other, relatively low-melting-point metals to be similarly suitable for application in lieu of Indium.

Furthermore, the present invention advantageously uses an alternating or oscillating electromagnetic field of a certain specified frequency to excite electron eddy currents in the metal bonding layer. This heats the layer and forces the layer to change phases from solid to liquid. In liquid form and under the influence of capillary action, the metal flows between the conductive coatings to conform to the surfaces of the surrounding piezoelectric material or conductive coatings. When the field is removed and as the metal cools, it bonds with the conductive coatings to form a conductive bond therewith, allowing the printhead to carry electric currents uniformly during operation of the printhead.

In a preferred embodiment of the present invention, the electromagnetic field is produced in a conventional manner by a pair of high frequency coils coupled to a frequency generator. These coils cooperate to produce a field that induces eddy currents in electrically-conductive materials, such as metal, placed in the field. The printhead is placed between the coils and the coils are energized for several seconds, in the case of a typical approximately one inch square printhead, to melt the metal adequately.

The present invention is further useful in double-u printhead configurations, wherein both the upper and lower piezoelectric members have indentations therein. Accordingly, in one embodiment of the present invention, the method further comprises the step of forming, prior to the step of depositing the metal, a second elongated indentation in the upper surface, the second indentation extending through the second coating and into the lower member.

The electromagnetic field is operated at a certain strength, at a certain frequency and for a specified length of time. The strength, frequency and time interval determine how high a temperature the metal reaches, a temperature sufficient for the printhead uniformly to reach a predetermined temperature below the Curie point of the piezoelectric material but above the melting point of the Indium metal. The time should be sufficient for the metal to melt completely and to flow throughout the area to be joined.

The above descriptions of an ink jet printhead have been directed to printheads having only one indentation per member and thus only one ink-ejecting channel per printhead. Those skilled in the art should understand that ink jet printheads almost universally have more than one channel, such that an array can be formed in the printhead for rapid printing of a matrix of ink dots to form characters on paper. The method of the present invention therefore preferably comprises the step of forming a plurality of elongated indentations in the upper piezoelectric member prior to the step of depositing.

The indentations in the upper and lower members are aligned when the printhead is assembled. A top surface of the first indentation forms a top wall of the channel, a bottom surface of the second indentation forms a bottom wall of the channel and sides of the first and second indentations cooperate to form sidewalls of the channel.

In a preferred embodiment, the indentations are formed by sawing into the members with a conventional saw. Therefore, the indentations have generally rectangular crosssections. In multi-channel printheads, the indentations or sawcut grooves are substantially parallel.

In a preferred embodiment of the present invention, the first and second conductive coatings are a composition comprising Nickel and Chromium. Gold is plated over the Nickel and Chromium to form an efficient conducting layer. The Indium metal melts and forms a bond with the Gold overplating to form a good electrical joint.

Another object of the present invention is to control deposition of the metal to control thickness of the layer that results after the steps of inducing and cooling. To achieve this tight control, the step of depositing the metal comprises a process selected from the group consisting of plating, vacuum deposition and sputtering. The advantage of this tight control is uniform electromagnetic field intensity within the printhead during operation.

There appear to be two further advantages attendant to use of Indium metal versus the epoxy of the prior art. First, the printhead apparently does not need to be clamped as rigidly during heating and cooling, because the Indium metal holds the two members together mechanically from the beginning. Second, surface tension in the metal tends to align the first and second indentations during the step of inducing. Thus, if there is any misalignment in the upper and lower members when the printhead enters the field, that misalignment is substantially reduced during heating. This ensures more reliable channel formation and greater production yield.

Finally, in a preferred embodiment, the first and second members are portions of a single piezoelectric member during the steps of coating and depositing. In double-u configurations, the indentation or indentations are formed in the single member at this point. Then the single member is divided along a line perpendicular to the indentations to form the separate upper and lower members. The now-separate upper member is placed over the lower member as described above.

The foregoing has outlined rather broadly the features and technical advantages of the present invention so that the detailed description of the invention that follows may be better understood. Additional features and advantages of the invention will be described hereinafter that form the subject of the claims of the invention. Those skilled in the art should appreciate that the conception and the specific embodiment disclosed may be readily used as a basis for modifying or designing other structures for carrying out the same purposes of the present invention. Those skilled in the art should also realize that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
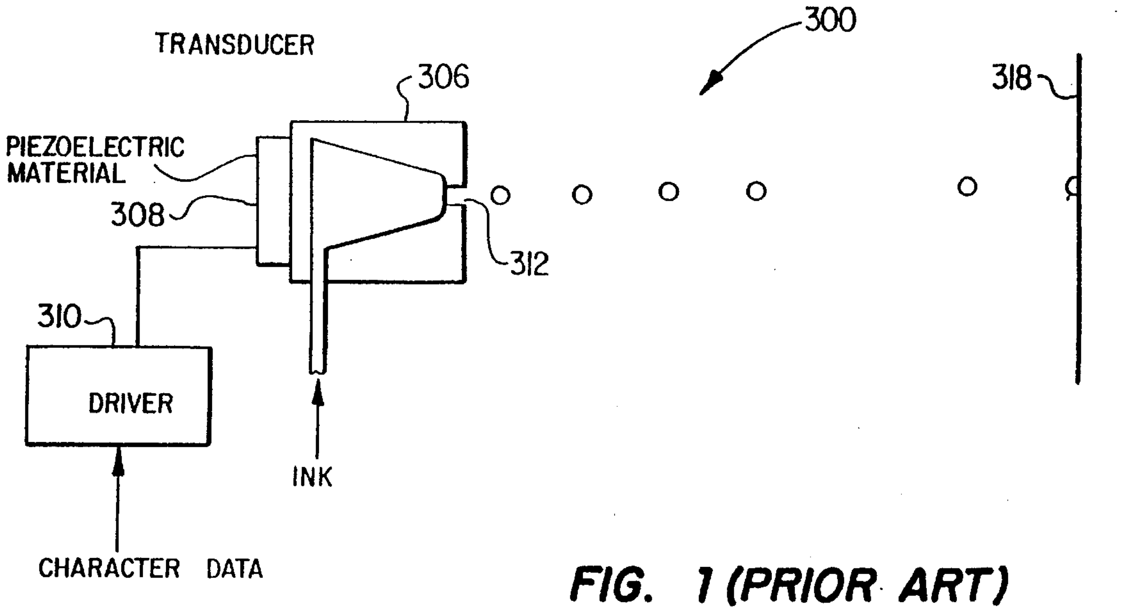
FIG. 1 (PRIOR ART)
FIG. 1 illustrates a prior art drop-on-demand ink jet printer.

Reference is now made to the drawings, where thicknesses and other dimensions have been exaggerated in various Figures as deemed necessary for explanatory or illustrative purposes and where like reference numerals designate the same or similar elements throughout the several Figures. FIG. 1 has been discussed in the Background of the Invention.

Many prior art printheads consist of two or more individual PZT members that are appropriately poled and joined together. The joining technique used for those prior art printheads employed electrically conductive adhesive, e.g., Silver-filled epoxy. As previously described, this technique requires extensive fixturing and manual handling. Further, the adhesive requires an elevated temperature to promote crosslinking, i.e. "curing." The disadvantage of the electrically conductive adhesive is questionable resistivity (conductivity) throughout the joints between the individual PZT members. With such adhesive, it is imperative to apply pressure to the members to ensure a uniformly thin bond line. Therefore, precise clamping was required.

In the present invention, the disadvantages of the prior art are eliminated by using a Indium metal having a relatively low melting point. In a preferred embodiment, this metal comprises Indium. The Indium Corporation manufactures a wide array of Indium metal alloys. The metal or alloy for use with the present invention should have as low a melting point as possible.

Figure 2:
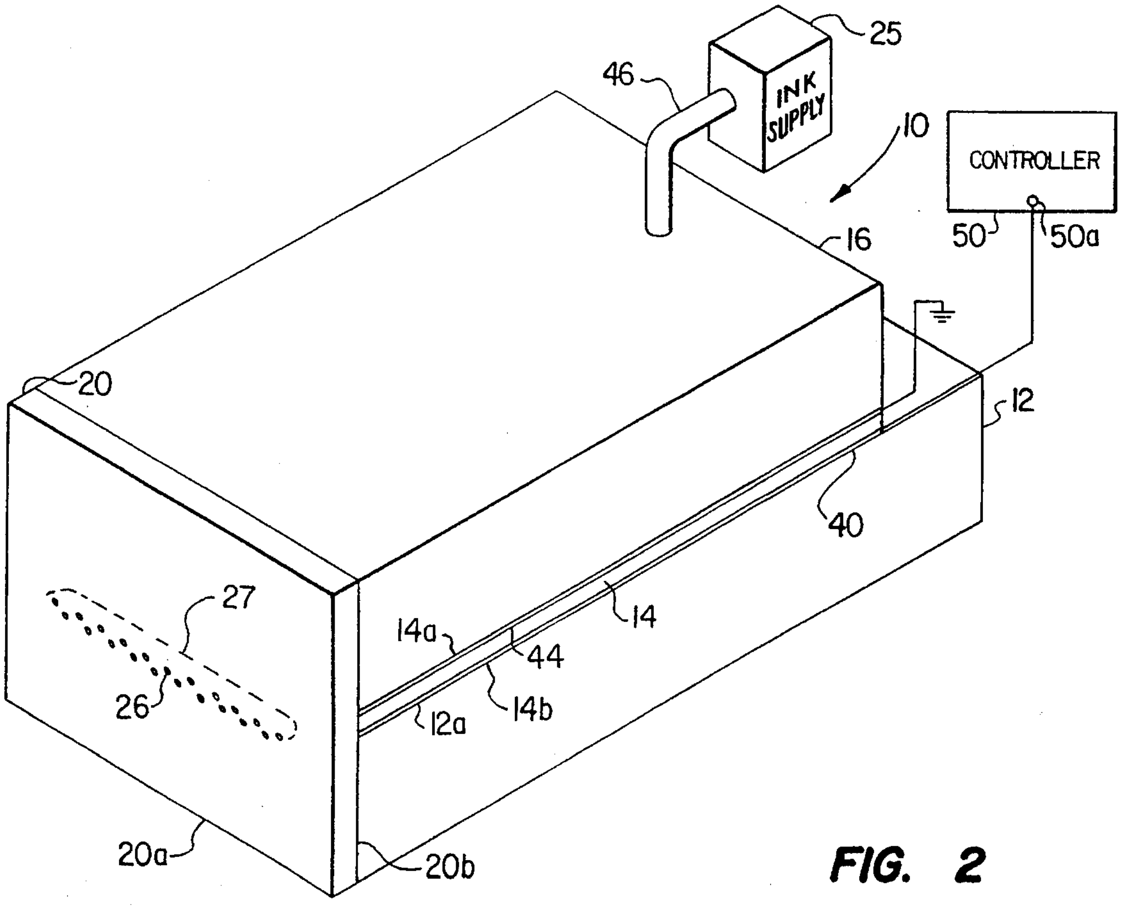
FIG. 2 illustrates an isometric view of a fully assembled high density ink jet printhead providing a preferred environment within which to practice the present invention.

The present invention is best described within the broader framework of the assembly of a complete, high density printhead. With reference to FIG. 2, illustrated is an isometric view of a fully assembled high density ink jet printhead 10 providing a preferred environment within which to practice the present invention. The ink jet printhead 10 includes a main body portion 12 aligned, mated and bonded to an intermediate body portion 14 that, in turn, is aligned, mated and bonded to a top body portion 16. In the embodiment illustrated herein, a surface **12*a* of the main body portion 12 and the surface 14*b* of the intermediate body portion 14 are conductively mounted to each other solely by a first conductive bonding layer 40 and the surface 14*a* of the intermediate body portion 14 and the surface 16*a* of the top body portion are conductively mounted to each other solely by a second conductive bonding layer 44**.

A manifold (not visible in FIG. 2) in communication with ink-carrying channels (also not visible in FIG. 2) is formed near the rear portion of the ink jet printhead 10. Preferably, the manifold is comprised of a channel formed in the top body portion 16 and that extends generally perpendicular to the ink-carrying channels formed in the main and intermediate body portions 12, 14. The manifold communicates via an internal conduit (not visible in FIG. 2) extending vertically through the top body portion 16 and an external ink conduit 46 to provide means for supplying ink to the ink-carrying channels from a source of ink 25 connected to the external conduit 46.

Continuing to refer to FIG. 2, the ink jet printhead 10 further includes a front wall 20 having a front side **20*a*, a back side 20*b* and a plurality of generally tapered orifices 26 extending therethrough. The back side 20*b* is aligned, mated and bonded with the main, intermediate and top body portions 12, 14 and 16, respectively, such that each orifice 26 is in communication with a corresponding one of the plurality of channels formed in the intermediate body portion 14. Preferably, each orifice 26 should be positioned such that it is located at the center of the end of the corresponding channel, thereby providing ink ejection nozzles for the channels. It is contemplated, however, that the ends of each of the channels could function as orifices for the ejection of drops of ink in the printing process without the necessity of providing the front wall 20 and the orifice array 27. It is further contemplated that the dimensions of the orifice array 27 comprised of the orifices 26 could be varied to cover various selected lengths along the front wall 20 depending on the channel requirements of the particular ink jet printhead 10 envisioned. Preferably, the orifice array 27** should be comprised of two, three or more rows of orifices separated by a small distance.

In the embodiment illustrated in FIG. 2, the main body portion 12 extends rearwardly past the intermediate body portion 14 and the top body portion 16, thereby providing a surface on the ink jet printhead 10 on which the controller 50 may be mounted. It is fully contemplated, however, that the main body portion 12, the intermediate body portion 14 and the top body portion 16 may all be of the same length, thereby requiring that the controller 50 be remotely positioned with respect to the ink jet printhead 10.

Figure 3:
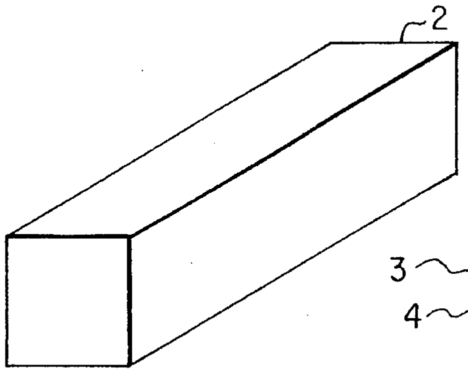
FIG. 3 illustrates a perspective view of a rectangular block of unpolarized piezoelectric material for use in manufacturing a high density, sidewall actuated, parallel channel ink jet printhead constructed in accordance with the teachings of the present invention.

Turning now to FIG. 3, illustrated is a perspective view of a rectangular block of unpolarized piezoelectric material for use in manufacturing a high density, sidewall actuated, parallel channel ink jet printhead constructed in accordance with the teachings of the present invention. In most cases, piezoelectric material is provided in powder form and must be pressed into a generally rectangular shape such as that illustrated here. Once pressed into a generally rectangular shape, the piezoelectric material is then fired and the surfaces smoothed by grinding to produce a generally rectangular block 2 of piezoelectric material having desired length, width and height dimensions. The exact length, width and height of the generally rectangular block 2 will vary depending upon the size of the high density parallel channel array for an ink jet printhead to be manufactured. In the preferred embodiment of the invention, the piezoelectric material is selected to be PZT. It should be clearly understood, however, that other comparable piezoelectric materials could be used to manufacture the channel array for the ink jet printhead without departing from the scope of the invention.

Figure 4:
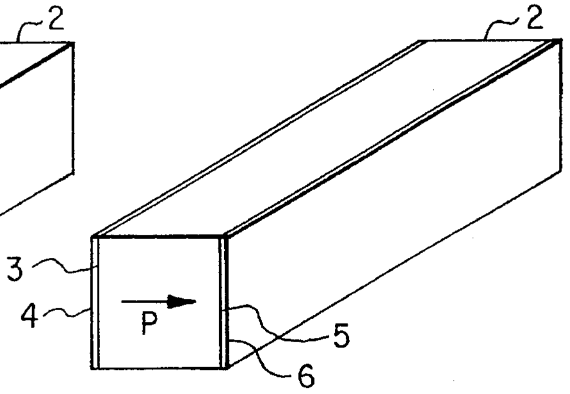
FIG. 4 illustrates a perspective view of the block of piezoelectric material of FIG. 3 after first surface pair metallizing and block polarizing steps;.

Turning now to FIG. 4, illustrated is a perspective view of the block of piezoelectric material of FIG. 3 after first surface pair metallizing and block polarizing steps. The rectangular block 2 is polarized in a selected direction "P." To polarize the rectangular block 2, opposing surfaces 3, 5 of the rectangular block 2 are first metallized by applying, for example, by a deposition process, respective layers 4, 6 of a conductive (possibly metallic) material thereon. Next, a high voltage of a predetermined value would be applied between the metallic layers 4 and 6 to polarize the rectangular block 2. The direction of polarization thus created for the rectangular block 2 is illustrated by arrow "P" and corresponds to the direction of the voltage drop between layers 4 and 6. For example, to polarize rectangular block 2 in the illustrated direction, a positive voltage with respect to the layer 6 would be applied to the layer 4. After polarization is complete, metallic layers 4 and 6 are then removed by conventional means.

Figure 5:
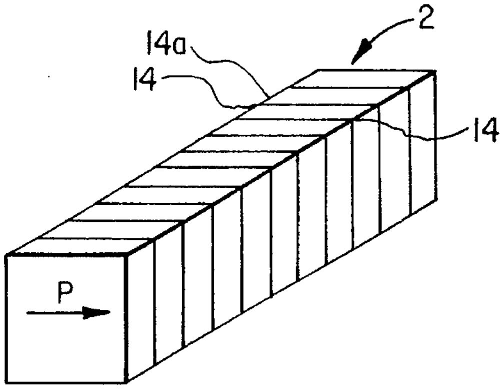
FIG. 5 illustrates a perspective view of the metallized and polarized block of piezoelectric material of FIG. 4 after demetallizing and slicing steps.

Turning now to FIG. 5, illustrated is a perspective view of the metallized and polarized block of piezoelectric material of FIG. 4 after demetallizing and slicing steps. The polarized rectangular block 2 of PZT has been machined into a plurality of thin sheets 14, each of a predetermined thickness, for example, by a sawing process. The individual thin sheets 14 are then lapped and the larger opposing surfaces 14*a* and 14*b* (see FIG. 6) would be metallized to provide a first metallized conductive surface 36 and a second metallized conductive surface 38. In the preferred embodiment, the metallization process would be accomplished by depositing a layer of a Nickel and Chromium alloy with Gold overplating on each of the surfaces 14*a* and 14*b*. It should be clearly understood, however, that the aforementioned deposition process is but one manner in which a layer of conductive material may be applied to the surfaces 14*a*, 15*b* and that numerous other conductive materials would be suitable for use as the metallized conductive surface.

Figure 6:
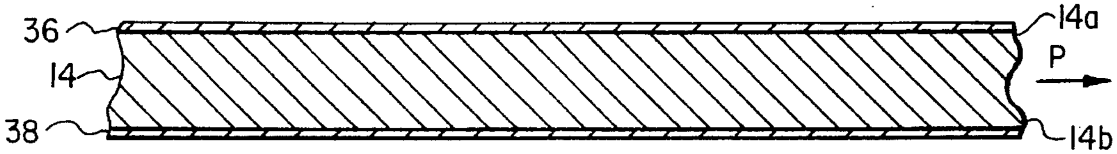
FIG. 6 illustrates a partial front end elevational view of a single sheet of the polarized piezoelectric material of FIG. 5 after a second surface pair metallizing step.

Turning now to FIG. 6, illustrated is a partial front end elevational view of a single sheet of the polarized piezoelectric material of FIG. 5 after a second surface pair metallizing step. An individual thin sheet 14, that shall hereafter be referred to as an intermediate body portion 14 for the ink jet printhead 10, having first and second metallized conductive surfaces 36 and 38 is seen.

Figure 7:
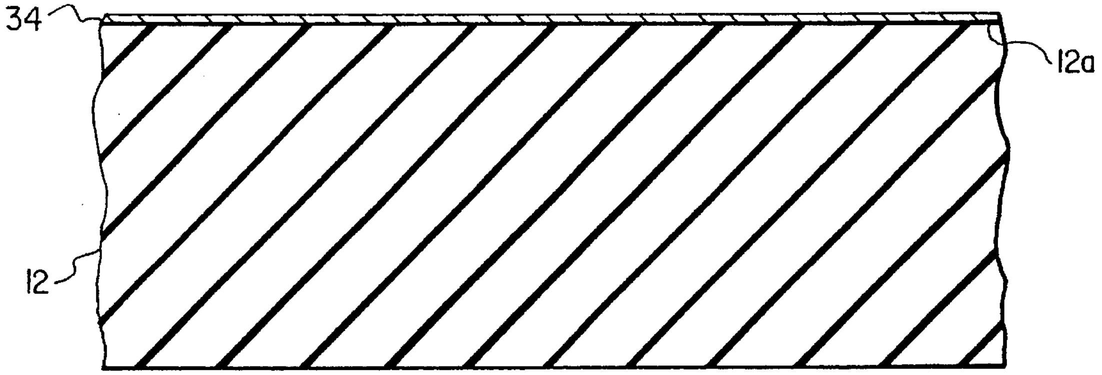
FIG. 7 illustrates a partial front end elevational view of a second block of unpolarized piezoelectric material such as that illustrated in FIG. 5 after a single surface metallizing step.

Turning now to FIG. 7, illustrated is a partial front end elevational view of a second block of unpolarized piezoelectric material such as that illustrated in FIG. 3 after a single surface metallizing step. A main body portion 12 of the high density ink jet printhead 10 may now be seen. It is fully contemplated, however, that the main body portion 12 need not be formed from an unpolarized a piezoelectric material and may be formed from any inactive material. The main body portion 12 is formed from a piezoelectric material using a process similar to that used to form the intermediate body portion 14 except that, after a second block of piezoelectric material is formed from powdered piezoelectric material, the second block is not polarized and, after, a slice is lapped from the second block to form the main body portion 12, only one of the larger surfaces 12*a* is metallized to provide a third metallized conductive surface 34.

In an alternate, preferred, embodiment of the invention, the main body portion 12 is formed from a piece of polarized piezoelectric material.

Figure 8:
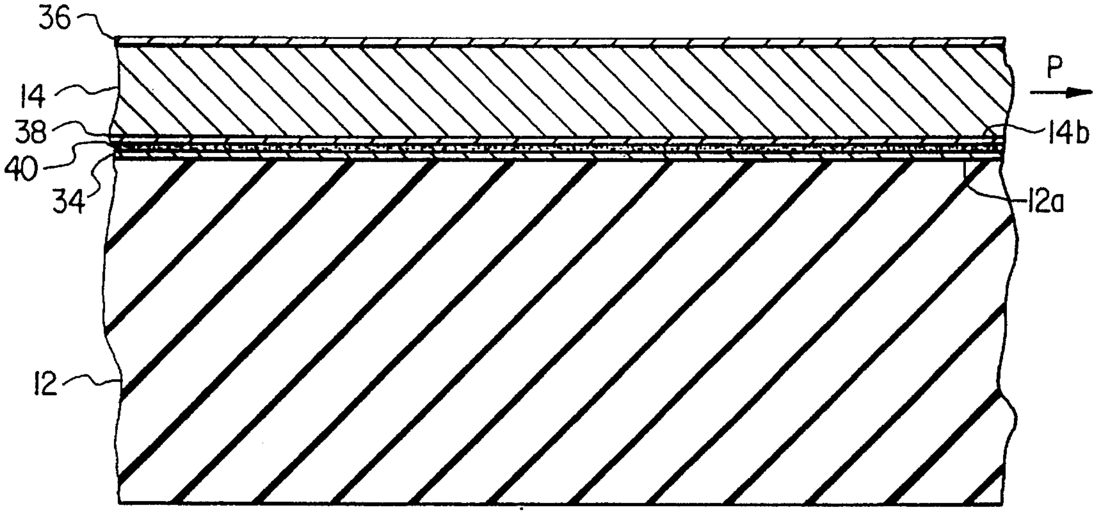
FIG. 8 illustrates a partial front end elevational view of the unpolarized and metallized block of piezoelectric material of FIG. 7 and the polarized and metallized block of piezoelectric material of FIG. 6 after mating and bonding.

Turning now to FIG. 8, illustrated is a partial front end elevational view of the unpolarized and metallized block of piezoelectric material of FIG. 7 and the polarized and metallized block of piezoelectric material of FIG. 6 after mating and bonding. Shown are the intermediate body portion 14 (which may be viewed as the upper piezoelectric member) relative to the main body portion 12 of FIG. 6 mated and bonded to the main body portion 12 (which may be viewed as the a lower piezoelectric member) relative to the intermediate body portion 14 of FIG. 7 by depositing a conductive metal such as Indium having a melting point less than the Curie points of the main body portion 12 and the intermediate body portion 14 over the lower surface of the intermediate body portion and mating and bonding the intermediate body portion with the main body portion 12 in a manner more fully described below).

The present invention is directed to use of a metal to accomplish the bonding, instead of a conductor-filled epoxy. The second and third conductive surfaces 38, 34 are typically a composition of Nickel and Chromium, overplated by Gold.

In a preferred embodiment of the present invention, the Indium metal forming first conductive bonding layer 40 is deposited on the conductive coating 38 by plating, vacuum deposition, sputtering or other well-known thin film deposition techniques. These deposition techniques provide uniformity of thickness of the final joint without having to apply pressure to the printhead to do so. In fact, these deposition techniques are capable of producing metal films having a thickness on the order of the surface roughness of the surfaces of the piezoelectric members. In the illustrated preferred embodiment, the deposited metal has a thickness of less than 0.001 inch.

It is contemplated that, in accordance with one embodiment of the invention, one or both of the metallized conductive surfaces 34 and/or 38 may be eliminated while maintaining satisfactory operation of the high density ink jet printhead 10 so long as the surface 14*b* of the intermediate body portion 14 and the surface 12*a* of the main body portion 12 are conductively mounted together and a voltage may be readily applied to the first conductive bonding layer 40 provided therebetween. Thus, in this specific embodiment of the invention, it is contemplated that a single conductive bonding layer 40 is used to conductively mount the surfaces 12*a* and 14*b* to each other. It should be noted, however, that the use of metal would not be available for use when the metallized conductive surfaces 34, 38 have been eliminated.

Once the metal has been deposited and the intermediate body portion 14 has been mated to the main body portion 12, the present invention calls for the printhead to be placed in an electromagnetic field 103 (see FIG. 11) to raise the temperature of the metal to a preselected temperature chosen to be high enough to melt the metal comprising the first conductive bonding layer 40 thoroughly without destroying the poling of the PZT materials by exceeding their respective Curie points. In a preferred embodiment of the invention, the electromagnetic field oscillates at a frequency on the order of 5 MHz. This excites the free electrons of the Indium metal directly, without having to conduct heat to the Indium through the piezoelectric material, as in infrared heating.

At frequencies lower than 5 MHz, it is difficult to place sufficient energy in the field to cause the metal to melt uniformly. Much above 5 MHz, skin effects begin to decrease the penetration depth of the field in the printhead, tending thereby to cause excess energy to be dissipated into the piezoelectric members, rather than into the first conductive bonding layer 40 typically located near the center of the printhead.

While the metal comprising the first conductive bonding layer 40 is in liquid form, surface tension within the metal and between the metal and the surfaces 38, 34 causes the intermediate body portion 14 to align with the main body portion 12. This is a distinct advantage over the prior art technique that required precise clamping to achieve proper alignment.

After the printhead has exited the field and the metal has been allowed to cool a sufficient period of time, a machining process is then commenced to form a channel array for the ink jet printhead.

Figure 9:
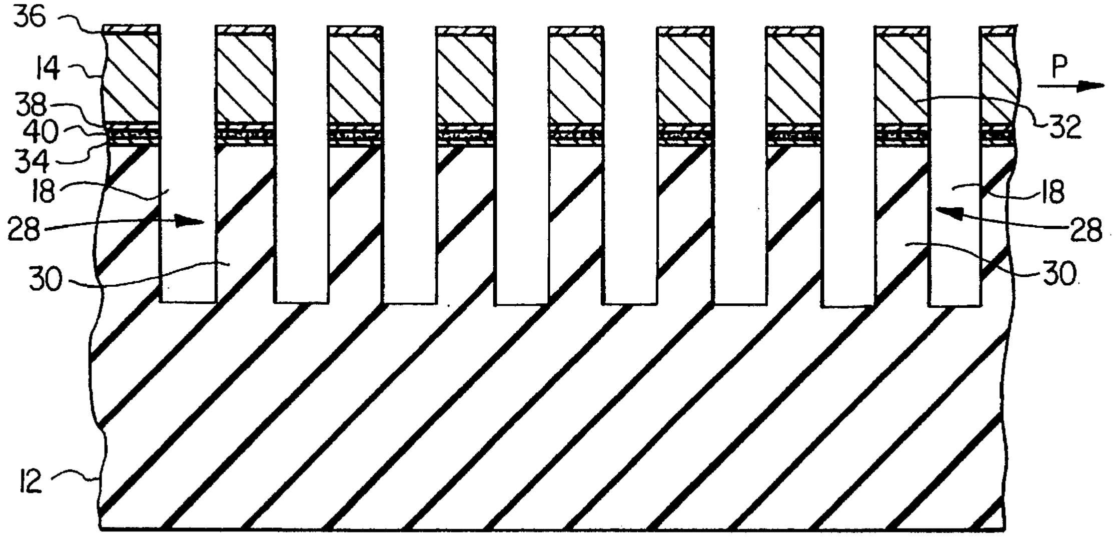
FIG. 9 illustrates a partial front end elevational view of the block of piezoelectric material of FIG. 8 after a machining step.

Turning now to FIG. 9, illustrated is a partial front end elevational view of the block of piezoelectric material of FIG. 8 after a machining step. A series of axially extending, substantially parallel channels 18 are formed by machining grooves (or indentations) that extend through the intermediate body portion 14 and the main body portion 12. Preferably, the machining process should be performed such that each channel 18 formed thereby should extend downwardly such that the metallized conductive surface 36, the intermediate body portion 14, the metallized conductive surface 38, the first conductive bonding layer 40, the metallized conductive surface 34 and a portion of the main body portion 12 are removed. It is also preferred that the channels 18 are formed such that they axially extend in a direction generally perpendicular to the poling direction P of the intermediate body portion 14. Furthermore, as various aspects of the invention may be practiced by either not extending the machining process into the main body portion 12 or by varying the extent to which the machining process extends into the main body portion, it is contemplated that the ratio of the height of the portion of the main body portion 12 removed with respect to the height of the intermediate body portion 14 may vary dramatically, depending on the particular aspect of the invention to be practiced. For example, it is contemplated that, in various aspects of the invention, the aforementioned ratio of the height of the portion of the main body portion 12 removed by the machining process to the height of the intermediate portion 14 machined through may extend to infinity, i.e. where the portion of the main body portion 12 removed approaches an infinitely small height. It should be noted, however, that by forming the substantially parallel channels 18 such that the height of the section of the main body portion 12 removed by the machining process corresponds to approximately 1.3 times the height of the section of the intermediate body portion 14 removed has been proven suitable in use.

In this manner, the channels 18 that comprise the channel array for the ink jet printhead 10 and sidewall actuators 28, each having a first sidewall actuator section 30 and a second sidewall actuator section 32, that define the sides of the channels 18 and that also produce ink ejecting pressure pulses in the channels 18 adjacent thereto are formed.

Figure 10:
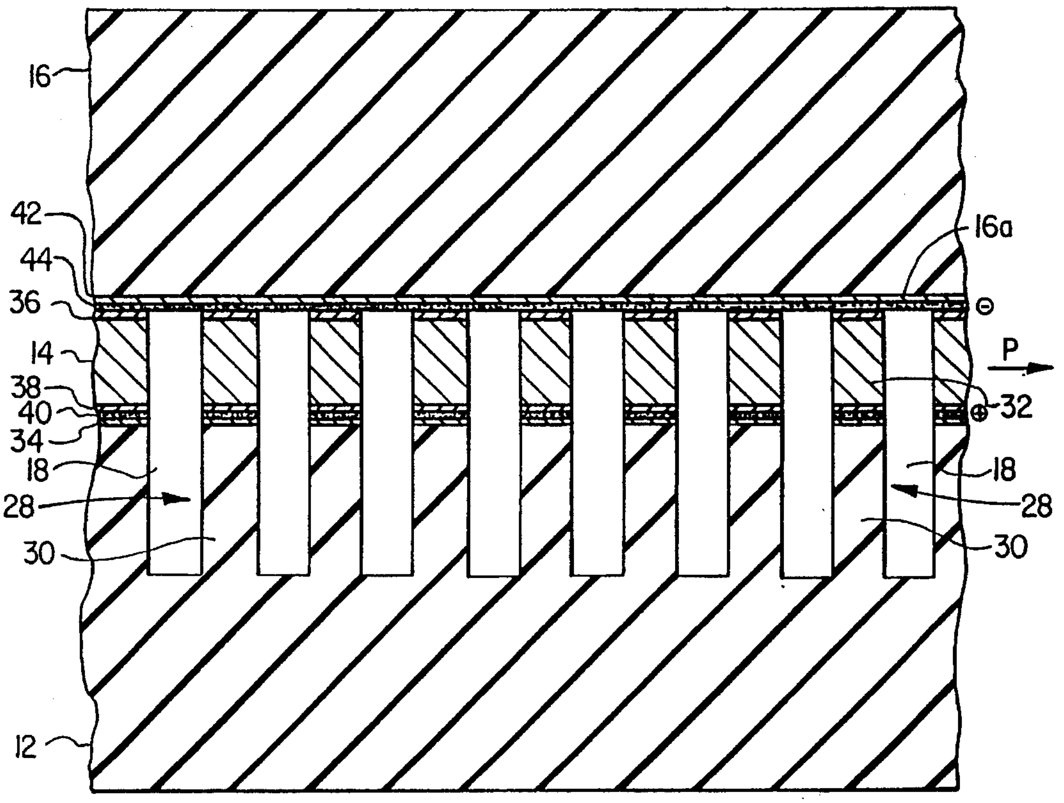
FIG. 10 illustrates a partial front end elevational view of a fully assembled high density parallel channel array for an ink jet printhead constructed by mating a second block of unpolarized, metallized piezoelectric material such as that illustrated in FIG. 7 to the machined block of piezoelectric material illustrated in FIG. 9.

Turning now to FIG. 10, illustrated is a partial front end elevational view of a fully assembled high density parallel channel array for an ink jet printhead constructed by mating a second block of unpolarized, metallized piezoelectric material such as that illustrated in FIG. 7 to the machined block of piezoelectric material illustrated in FIG. 9. The now fully assembled channel array for the ink jet printhead 10 may be seen. The channel array for the ink jet printhead 10 is formed by conductively mounting a third block 16 (which may be viewed as the upper piezoelectric member relative to the intermediate body portion 14) of unpolarized piezoelectric material having a metallized conductive surface 42 formed thereon to the metallized conductive surface 36 of the intermediate body portion 14 (which may be viewed as lower piezoelectric member relative to the third block 16). The third block 16, that hereafter shall be referred to as the top body portion 16 of the ink jet printhead 10, may be constructed in a manner similar to that previously described with respect to the main body portion 12. To form the top body portion 16, a generally rectangular block of piezoelectric material is formed from powdered piezoelectric material. The metallized conductive surface 42 is then formed on surface 16*a* of the top body portion 16, preferably by a deposition process. Again, while it is preferred that the top body portion 16 is formed from an unpolarized piezoelectric material, it is fully contemplated that the top body portion 16 need not be formed from a piezoelectric material and may be formed from any suitable inactive material.

To complete assembly of the channel array for the ink jet printhead 10, the metallized conductive surface 42 of the top body portion 16 is conductively mounted to the metallized conductive surface 36 of the second sidewall section 32 by a second conductive bonding layer 44.

To bond the top body portion 16 to the intermediate body portion 14, the present invention employs a metal, preferably containing Indium as the first conductive bonding layer 40. However, it is important to note that an Indium solder joint already exists between the intermediate body portion 14 and the main body portion 12. Therefore, the second conductive bonding layer 44 should be a different metal or alloy having a melting point below that of the first conductive bonding layer 40 and below each of the Curie points of the PZT materials of which the top, intermediate, and main body portions may be made.

Once the second conductive bonding layer 44 metal has been deposited and the top body portion 16 has been mated to the intermediate body portion 14, the present invention calls for the printhead to be placed in the electromagnetic field 103 (see FIG. 11) to raise the temperature of the metal to a preselected temperature chosen to be high enough to melt the second conductive bonding layer 44 thoroughly without melting the first conductive bonding layer 40 or destroying the poling of the PZT materials by exceeding their Curie point. Again, while the metal is in liquid form, surface tension within the metal and between the metal and the surfaces 42, 36 causes the top body portion 16 to align with the intermediate body portion 14. After the second conductive bonding layer 44 has been allowed to reflow, the printhead is removed from the field and allowed to cool again.

As before, it is contemplated that, in one embodiment of the invention, either one or both of the metallized conductive surfaces 36 or 42 may be eliminated while maintaining satisfactory operation of the high density ink jet printhead 10 so long as the surface 14*a* of the intermediate body portion 14 and the surface 16*a* of the top body portion 16 are conductively mounted together and that the second conductive bonding layer 44 provided therebetween may be readily connected to ground. Thus, in this specific embodiment of the invention, it is contemplated that the second conductive bonding layer 44 may be used alone to conductively mount the surfaces 14*a* and 16*a* to each other. As may now be seen, the plurality of vertical grooves of predetermined width and depth previously formed through the intermediate body portion 14 and the main body portion 12 and the surface 16*a* of the top body portion 16 define a plurality of ink-carrying channels 18, thereby providing the channel array for the ink jet printhead 10.

Figure 11:
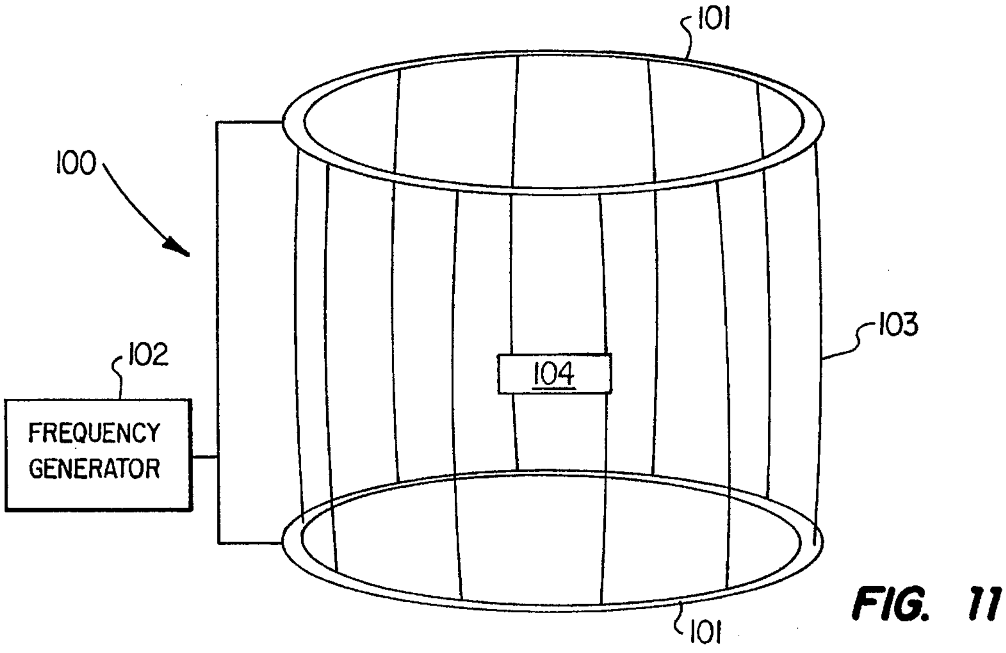
FIG. 11 schematically illustrates an electromagnetic field generating apparatus inducing a current in a printhead.

FIG. 11 schematically illustrates an electromagnetic field generating apparatus inducing a current in a printhead 104. Those skilled in the art should understand that FIG. 11 is purely representational, and is not meant to show an actual configuration. Those skilled in the art are aware of such apparatus and their operation. The apparatus, generally designated 100, comprises a pair of high frequency coils 101 coupled to a frequency generator 102. These coils 101 cooperate to produce a field (represented by field lines 103) that induces eddy currents in electrically-conductive materials, such as metal, placed in the field. The printhead 104 is placed between the coils 101 and the coils 101 are energized for several seconds at a frequency of approximately 5 MHz, in the case of a typical approximately one inch square printhead, to melt the metal comprising the first or second conductive bonding layer 44 adequately.

From the above, it is apparent that the present invention discloses a method of manufacturing an ink jet printhead comprising the steps of: (1) coating a substantially flat lower surface of an upper piezoelectric member with a first conductive coating, (2) coating a substantially flat upper surface of a lower piezoelectric member with a second conductive coating, (3) depositing a conductive metal over the first conductive coating, (4) forming a first elongated indentation in the lower surface, the first indentation extending through the first coating and through the upper member, (5) joining the metal with the second conductive coating by placing the upper piezoelectric member over the lower piezoelectric member, (6) inducing a current in the metal with an electromagnetic field having a specified frequency to thereby melt the metal and (7) cooling the metal, the metal electrically and mechanically joining the first coating to the second coating, the first indentation and the upper surface thereby forming the channel, the channel capable of containing ink and capable of ejecting ink therefrom when an externally-applied electromagnetic field distorts the upper and lower piezoelectric members.

Although the present invention and its advantages have been described in detail, it should be understood that various changes, substitutions and alterations can be made herein without departing from the spirit and scope of the invention as defined by the appended claims.

What is claimed is:

1. A method of manufacturing a piezoelectric assembly, comprising the steps of:

providing an intermediate body portion having a substantially flat lower surface, said intermediate body portion being constructed of a piezoelectric material;

providing a main body portion having a substantially flat upper surface;

depositing a first conductive metal over said lower surface, said first conductive metal having a first melting point less than each of the respective Curie points of said intermediate and main body portions;

joining said first conductive metal with said upper surface by placing said intermediate body portion over said main body portion;

inducing a first current in said first conductive metal with a first electromagnetic field to thereby melt said first conductive metal without unduly heating said intermediate and main body portions; and cooling said first conductive metal, said first conductive metal electrically and mechanically joining said intermediate body portion to said main body portion, thereby forming the piezoelectric assembly.

2. The method as recited in claim 1 further comprising the step of forming a groove extending through said intermediate body portion and said first conductive metal, and said groove further extending into said main body portion.

3. The method as recited in claim 2 wherein surface tension in said first conductive metal substantially aligns said intermediate and main body portions during said step of inducing when said first conductive metal is melted.

4. The method as recited in claim 2 wherein said step of forming said groove further comprises the step of sawing into said intermediate and main body portions.

5. The method as recited in claim 2 and further comprising the steps of:

providing a top body portion having a bottom surface;

depositing on said bottom surface a second conductive metal having a second melting point less than said first melting point;

placing said top body portion on said intermediate body portion, such that said second conductive metal contacts said intermediate body portion and said bottom surface extends laterally across said groove;

inducing a second current in said second conductive metal with a second electromagnetic field to thereby melt said second conductive metal; and cooling said second conductive metal, said second conductive metal electrically and mechanically joining said top body portion to said intermediate body portion.

6. The method as recited in claim 1 wherein said step of inducing further comprises the step of placing said intermediate and main body portions within said first electromagnetic field for a predetermined period of time.

7. The method as recited in claim 1 wherein said first conductive metal is less than 0.001 inch in thickness following said step of cooling.

8. The method as recited in claim 1 wherein said intermediate body portion is poled in a preselected direction.

9. The method as recited in claim 1 wherein said step of depositing is performed by a process selected from the group consisting of:

plating;

vacuum depositing; and sputtering.

10. A method of manufacturing an ink jet printhead having a channel defined therein, comprising the steps of:

coating a substantially flat lower surface of an intermediate body portion with a first conductive coating, said intermediate body portion being made of a piezoelectric material;

coating a substantially flat upper surface of a main body portion with a second conductive coating;

depositing a first conductive metal over said first conductive coating;

joining said first conductive metal with said second conductive coating by placing said intermediate body portion over said main body portion;

inducing a first current in said first conductive metal with a first electromagnetic field to thereby melt said first conductive metal without unduly heating said intermediate and main body portions;

cooling said first conductive metal, said first conductive metal electrically and mechanically joining said first conductive coating to said second conductive coating;

forming a groove extending through said intermediate body portion, said first conductive coating, said first conductive metal, and said second conductive coating; and mounting a top body portion to said intermediate body portion, thereby forming the ink jet printhead.

11. The method as recited in claim 10 wherein said forming step further comprises the step of forming said groove such that said groove extends into said main body portion.

12. The method as recited in claim 11 wherein surface tension in said first conductive metal substantially aligns said intermediate and main body portions during said step of inducing when said first conductive metal is melted.

13. The method as recited in claim 11 wherein the step of mounting a top body portion to said intermediate body portion further comprises the steps of:

coating a bottom surface of said top body portion with a third conductive coating;

coating a top surface of said intermediate body portion with a fourth conductive coating;

depositing on said third conductive coating a second conductive metal having a second melting point less than said first melting point;

placing said top body portion on said intermediate body portion, such that said second conductive metal contacts said fourth conductive coating and said bottom surface extends laterally across said groove;

inducing a second current in said second conductive metal with a second electromagnetic field to thereby melt said second conductive metal; and cooling said second conductive metal, said second conductive metal electrically and mechanically joining said third conductive coating to said fourth conductive coating.

14. The method as recited in claim 10 wherein said step of inducing further comprises the step of placing said intermediate and main body portions within said first electromagnetic field for a predetermined period of time.

15. The method as recited in claim 10 wherein said first and second conductive coatings are a composition comprising Nickel and Chromium.

16. The method as recited in claim 10 wherein said first conductive metal is less than 0.001 inch in thickness following said step of cooling.

17. The method as recited in claim 10 wherein said step of forming said groove further comprises the step of sawing through said intermediate body portion.

18. The method as recited in claim 10 wherein said step of depositing is performed by a process selected from the group consisting of:

plating;

vacuum depositing; and sputtering.

* * * * *